United States Patent [19]
Werrbach et al.

[11] Patent Number: 5,898,395
[45] Date of Patent: Apr. 27, 1999

[54] DRIFT CANCELING METHOD AND APPARATUS FOR ANALOG TO DIGITAL CONVERTERS

[75] Inventors: Donn R. Werrbach, Glendale; Gary Ross Liden, Pacoima, both of Calif.

[73] Assignee: Aphex Systems, Ltd., Sun Valley, Calif.

[21] Appl. No.: 08/835,562

[22] Filed: Apr. 8, 1997

[51] Int. Cl.$^6$ ............................................ H03M 1/06
[52] U.S. Cl. ............................................ 341/118
[58] Field of Search ........................... 341/118, 158, 341/155, 120

[56] References Cited

U.S. PATENT DOCUMENTS 4,745,394  5/1988  Cornett .................................. 341/155

*Primary Examiner*—Brian Young
*Attorney, Agent, or Firm*—Thomas I. Rozsa; Tony D. Chen; Jerry Fong

[57] ABSTRACT

A drift canceling method and apparatus is used in conjunction with an analog to digital converter. The drift canceling method and apparatus analyzes the duty cycle of the target analog to digital converter's most significant output data bit to determine if the average numeric value of the analog to digital converter's output data stream is data centered upon the analog to digital converter's numeric data range or if it is ranging above or below the data range center. If the average data value is above or below center, a servo error signal is generated which is added to the analog to digital converter's input signal to cause the analog to digital converter's average output data magnitude to slew towards the data range center. In this way, the average analog to digital converter output data offset is continuously canceled without interfering with the normal and continuous operation of the target analog to digital converter.

21 Claims, 3 Drawing Sheets

DRIFT CANCELING METHOD AND APPARATUS FOR ANALOG TO DIGITAL CONVERTERS

BACKGROUND OF THE INVENTION

1. Field of the Invention

The present invention generally relates to the field of digital signal processing. More particularly, the present invention relates to the field of analog to digital converters. In particular, the present invention relates to the field of analog to digital converters used mainly in a.c. signal conversion applications.

2. Description of the Prior Art

An analog-to-digital converter (hereafter referred as "ADC") is used in both a.c. and d.c. conversion applications. The ADCs are used to convert a.c. analog signals into digital output data, whereby a stable zero signal reference is desired to be maintained in the numeric output data over time and across temperature variations. Such applications include but are certainly not limited to digital audio.

Offset of the data stream (or digitized signal) produced by an ADC is the quantized numerical equivalent of an analog signal offset, and is an undesirable factor of error, especially if it drifts over time or temperature. Unavoidable data offset drift of an ADC results from the converter's intrinsic analog temperature coefficients which produce the net effect of a drifting conversion reference. It has been observed that even high grade ADC devices can produce a "center of data" drift equaling the magnitude of the third significant bit or greater over a reasonable operating temperature range. That is a relatively large amount of drift which must be eliminated for many applications.

Two prior art methods which have been widely used to cancel the output data offset of ADCs are digital highpass post-filtering and "auto zero" data offset compensation. Both methods have severe disadvantages in many potential applications for an ADC.

Digital highpass post-filtering requires a relatively complex digital signal processing (hereafter referred as "DSP") circuit added to the ADC, either internally as part of the integrated circuit or as an external support function. The cost of the additional post-filtering DSP may be prohibitive or there may occur other data errors due to DSP distortion. Additionally, the added conversion time introduced by the DSP post-filtering may limit the usefulness of this method.

Instead of DSP post-filtering, some presently available ADCs provide an internally programmed "auto zero" process to numerically subtract out the data offset. The disadvantage of this method is that it requires issuing a device instruction to the ADC which stops the converter flow for a period of time and puts the ADC through an offset cancellation procedure. Once the immediate data offset has been numerically subtracted from the data reference and the ADC is back into the operating mode, the data offset is subject to further drift. Frequent and timely operation of the auto zero function is therefore necessary to cancel the ADCs drifting output data offset. This option is simply not usable when continuous ADC operation is essential as for audio applications.

It is highly desirable to have a very efficient and also very effective design and construction of a novel offset canceling means to continuously cancel the output data offset of an ADC without interrupting the conversion flow. It is desirable to provide a novel offset canceling means which is relatively easy to design into new ADC devices, or easily applied as an external circuit to support existing ADCs. It is also desirable to provide a novel canceling means which is low in cost.

SUMMARY OF THE INVENTION

The present invention is a novel drift canceling means (hereafter referred as "DCM") for analog to digital converters. In the following text, the term "target ADC" shall hereafter refer to any ADC connected to the present invention DCM for having its digital output data offset canceled.

It is an object of the present invention to provide an offset canceling means to cancel the output data offset of a target analog to digital converter (hereafter referred as "target ADC").

It is also an object of the present invention to provide an offset canceling means to cancel the output data offset without interfering with the continuous and normal operation of the ADC.

It is an additional object of the present invention to provide an output data offset canceling means for a target ADC which can be applied, in principle, to any ADC.

It is a further object of the present invention to provide a DCM which is relatively simple and low in cost.

Briefly described, the present invention DCM analyzes the duty cycle of the target ADC's most significant output data bit (hereafter referred as "MSB") to determine if the average numeric value of the ADC's output data stream is data centered upon the ADC's numeric data range or if it is ranging above or below the data range center. If the average data value is above or below center, a servo error signal is generated which is added to the ADC's input signal to cause the ADC's average output data magnitude to slew towards the data range center. In this way, the average ADC output data offset is continuously canceled without interfering with the normal and continuous operation of the target ADC.

Alternately described, the present invention DCM comprises a servo loop wrapped around a target ADC for canceling the output data offset of the ADC. The servo loop comprises an integrator to convert the average duty cycle, i.e., the comparative amount of time in high and low logic states, of the MSB of the target ADC's streaming output data into an analog error signal indicating whether the average value of the streaming data is equal to the data range center or is above or below the center. The error signal is added to the analog input signal of the target ADC, thereby causing the ADC's output data to slew towards the data range center, this canceling the target ADC's output data offset without interfering in any way with the normal and continuous operation of the target ADC.

The concept of the present invention DCM is to create an analog-to-digital-to-analog serve loop to cancel a target ADC's output data offset using a conventional digital-to-analog converter (hereafter referred as "DAC") to convert the target ADC's whole output data word back into an analog voltage and then generate an error signal suitable to servo the ADC to a zero data offset. It has been discovered, according to the present invention, that the offset drift of a typical DAC was equally as great as that of typical ADCs. Therefore, no net benefit could be obtained from such a method. However, the novel and unique DCM of the present invention is to overcome the need to read the whole ADC output word to provide an error determination. The means devised is extremely stable and reliable, low in cost, simple to implement, and can be used with any target ADC. The key to the present invention DCM is understanding certain properties of the ADC's most significant bit (MSB) which will be explained forthwith.

3

For clarification only and not to limit the present invention, some relevant information about ADCs shall now be given. An ADC can output either a linear binary code or a two's complement code. Most ADCs today output two's complement since it more readily facilitates the coding of bipolar magnitudes, and is naturally compatible with Digital Signal Processors. The main difference between these two coding schemes, as it relates to the present invention, is the logic convention of their output MSB. For all data values greater than half scale, the state of the two's complement MSB is zero while the state of the linear binary MSB is one. For all data values below half scale the state of the two's complement MSB is one while the state of the linear binary MSB is zero.

The only consequence to the present invention of the opposite logic polarities of two's complement and linear binary MSB's is that the polarity of the offset canceling servo must be adjusted accordingly to be sure a negative feedback loop is constructed and a positive feedback loop is avoided. Such a requirement is achieved when the applied MSB causes the servo to slew the output data in a direction which will cause the MSB to eventually change to the opposite state. For the sake of simplicity only and not to limit the present invention in any way, the drawings shall hereafter show proper polarities for the use of a linear binary coded ADC. Simply inverting the polarity of the MSB is one way to cause the circuits to be appropriately modified for use with two's complement coded ADCs.

Since the MSB of an ADC's output data is clocked at a constant data rate, sequential ones and zeros are concatenated forming a variable duty cycle data stream of varying periodicity. Averaging the MSB's duty cycle is therefore equivalent to averaging the MSB's logical state.

Two key inferences can be made from the MSB's average duty cycle if a reasonable number of samples are taken. First, if the average duty cycle is 50%, then the average data must be at center scale, and there is no data offset. Second, if the MSB duty cycle is not 50%, then the average data value is either above or below center scale by an unknown amount but by a known direction. For example, if the average duty cycle for a linear binary MSB is over 50%, then the average data value must be above center scale. The same is true if the average two's complement MSB is less than 50% (due to the inverted MSB of two's complement coding). Conversely, if the linear binary MSB is less than 50%, or the two's complement MSB is greater than 50%, then the average data must be less than center scale. It will become apparent from the following detailed description how these inferences are utilized by the present invention to reliably and efficiently create a servo loop which will effectively cancel the output data offset of a target ADC.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
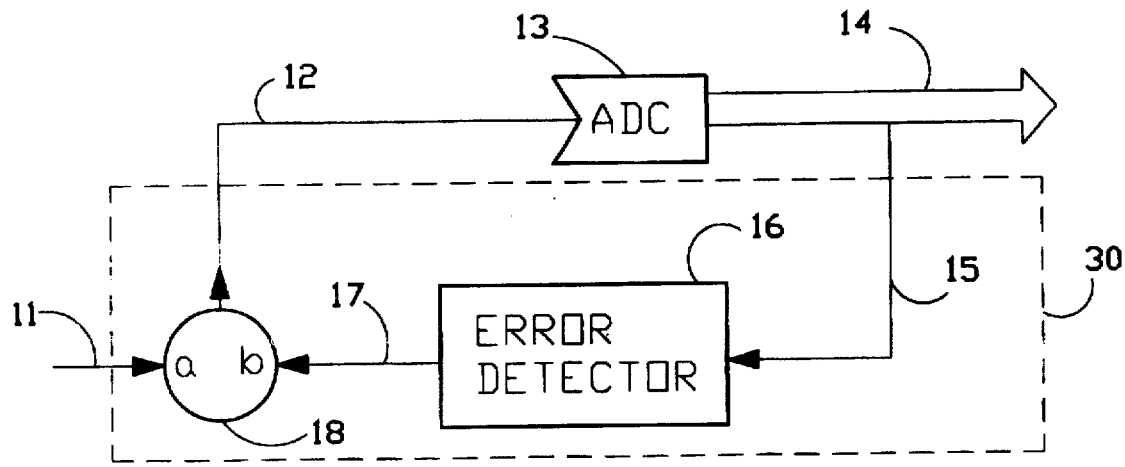
FIG. 1 is a simplified block diagram of the preferred embodiment of the present invention drift canceling means (DCM)

Referring to FIG. 1, there is depicted a basic block diagram of the present invention drift canceling means (DCM) 30 which comprises an analog-to-digital-to-analog servo loop utilizing only the MSB of a target DAC's output data word as the source for an error detection. The analog-to-digital portion is a target ADC 13 itself while the digital-to-analog portion comprises the DCM 30 of the present invention.

The target ADC 13 is coupled to receive an analog output signal 12 from the output of a summing means 18. The summing means 18 comprises two inputs "a" and "b". The summing input "a" is coupled to receive an analog input signal 11 which is the signal to be converted to digital by the target ADC 13. The other summing input "b" is coupled to receive an error output signal 17 generated by an error detector 16. The error detector 16 is coupled to receive the MSB 15 from the data output word 14 of the target ADC 13. The error detector 16 analyzes the average duty cycle of the MSB 15 to create the error output signal for slewing the output of the target ADC 13 towards zero offset. The error output signal 17 is added to the analog input signal 11 by the summing means 18 to produce a corrected output signal 12 which is coupled to the input of the target ADC 13.

It will be appreciated that the error detector 16 of the present invention DCM 30 may be constructed by many different circuits which may well perform the equivalent function of the error detector 16 within the spirit and scope of the present invention DCM 30. What is central to the present invention is the use of only the MSB 15 of the output data 14 coupled to the error detector 16 to create an error canceling servo around a target ADC 13. One truly novel feature of the present invention is the use of only the MSB 15 for the error determining source.

It has been shown in FIG. 1 that the MSB 15 is to be made available from the target ADC 13. As a practical matter, obtaining the MSB 15 from the output data word 14 may or may not require additional means depending upon the particular target ADC's provisions. For example, many presently used ADCs provide serial output data which would require finding some means to trap and sample out the MSB from the serial data word. For clarity of describing the present invention, no such MSB trapping means shall be considered in reference to FIG. 1, but it should be assumed or expected that such a means may need to be practiced in the application of the present invention.

Figure 2:
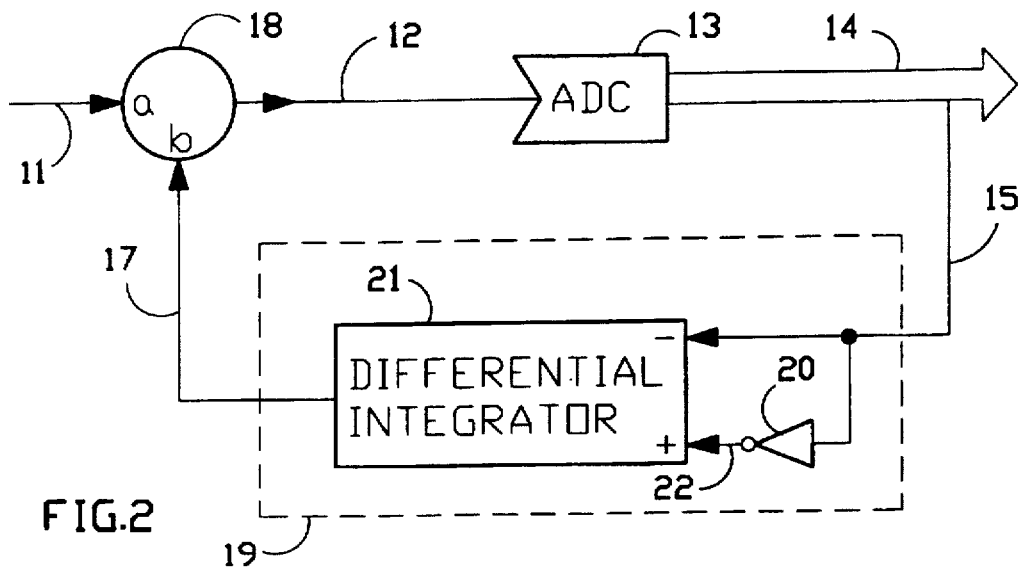
FIG. 2 is a simplified block diagram of another preferred embodiment of the present invention DCM.

Referring to FIG. 2, there is shown another embodiment of the present invention DCM 19. The technique of FIG. 2 embraces a natural aspect of the MSB, namely that the average MSB is symmetrical (50%) when the average data value is at zero offset, i.e., centered in the data span. The diagram of FIG. 2 will attempt to establish the condition at which the MSB and it's inverse are at the same duty cycle, a condition the exists only at the 50% duty cycle.

The MSB 15 taken from the data word 14 of target ADC 13 is simultaneously coupled to a negative input of a differential integrator 21 and a logic inverter 20. The output of logic inverter 20, which includes an output signal 22 equal to the inverse of the MSB 15, is coupled to a positive input of the differential integrator 21. The differential integrator 21 integrates the difference between the magnitude of the pulses of MSB 15 and it's inverse output signal 22 and generates an error output signal 17. If the MSB duty cycle is greater than 50%, then the error output signal 17 swings negatively from its prior value, causing a combined output signal 12 from the summing means 18 to be brought more negative in value and consequently bring the output data of the target ADC 13 to a lower value, and trending the MSB back to a 50% duty cycle. Conversely, if the MSB duty cycle is less than 50% then opposite action occurs, bringing the output data from the target ADC 13 to a higher value, and trending the MSB back toward a 50% duty cycle. When the MSB duty cycle is exactly 50%, then no change is imparted by the differential integrator 21 to the error output signal 17.

It will be appreciated that there are probably an unlimited number of circuits which could be constructed to perform the function of the differential integrator 21 shown in FIG. 2. It is emphasized that while the described differential integrator 21 is preferred, it is also within the spirit and scope of the present invention to have any differential integrating means used for the present invention.

Figure 3:
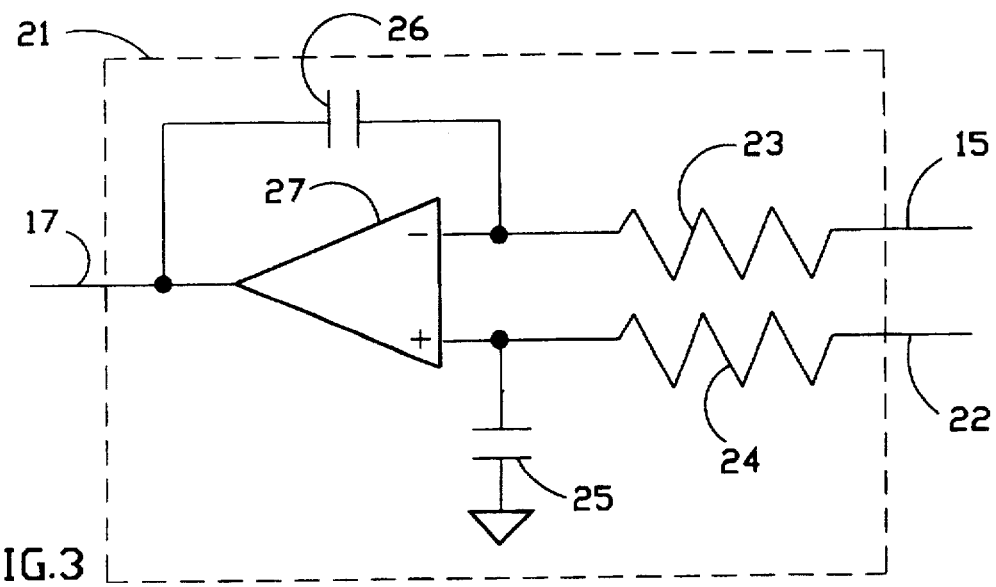
FIG. 3 is a schematic diagram of a differential integrator of the present invention DCM shown in FIG. 2.
Figure 4:
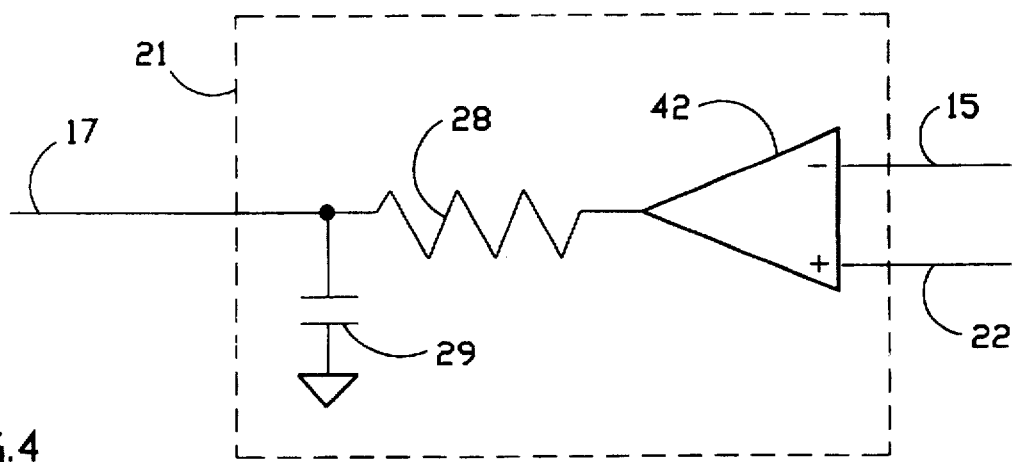
FIG. 4 is a schematic diagram of another differential integrator of the present invention DCM shown in FIG. 2.

By way of example only, FIGS. 3 and 4 show two practical circuits to construct the differential integrator 21 shown in FIG. 2. The circuit diagrams of FIGS. 3 and 4 are designated as 21 which is the designation of the differential integrator 21 shown in FIG. 2. Referring to FIG. 3, there is illustrated a classical opamp based differential integrator circuit 21 which includes an opamp 27, resistors 23 and 24, and capacitors 25 and 26. The time constant of resistor 23 with capacitor 26 and that of resistor 24 and capacitor 25 should be made approximately equal for best results.

Referring to FIG. 4, there is shown another differential integrator circuit 21 which is equivalent to the differential integrator 21 shown in FIG. 2. The differential integrator circuit 21 comprises a difference amplifier 42, a capacitor 29, and a resistor 28. The difference amplifier 30 is coupled to the input pulses of the MSB 15 and the inverse MSB 22 to generate an output pulse equal to the difference of the input pulses. The resulting output pulse is integrated by the time constant of resistor 28 and capacitor 29. It will be appreciated that the difference amplifier 42 may be an opamp difference amplifier or a differential comparator.

Figure 5:
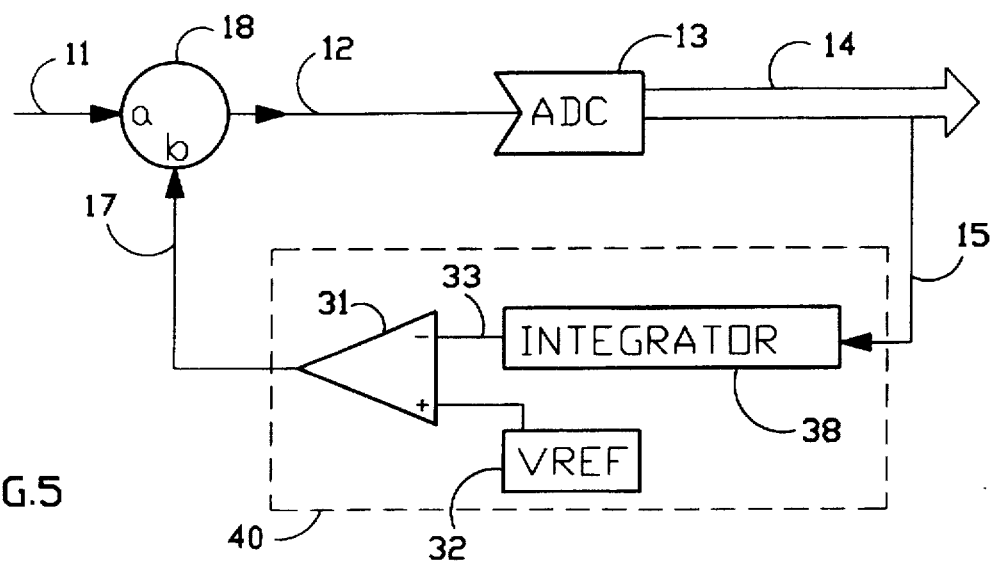
FIG. 5 is a simplified block diagram of a further preferred embodiment of the present invention DCM.

Referring to FIG. 5, there is shown a further embodiment of the present invention DCM 40. In this embodiment, the DCM 40 simply compares the integrated MSB to a stable reference voltage (hereafter referred as "Vref") 32 to determine if the MSB duty cycle is above or below 50%. Otherwise, operation in this figure is the same as the embodiment shown in of FIG. 2.

The MSB 15 taken from the data word 14 of target ADC 13 is coupled to the input of an integrator 38 for obtaining an integrated sample output voltage 33 proportional to the average duty cycle of the MSB 15. The sample output voltage 33 is subtracted from the Vref 32 by a difference amplifier 31 for generating the error output voltage 17. The voltage of Vref 32 is set approximately equal to the output voltage 33 of the integrator 38 when the average MSB duty cycle is 50%. It will be appreciated that the value of the Vref 32 need not be precise as long as it is close to the proper value. This is because the servo of the DCM 40 will tend to "home in" on the condition of a 50% MSB duty cycle which is the only truly determinate condition where the average MSB duty cycle can rest. Of course, setting the value of Vref 32 too far from the proper value will cause the servo to "hunt".

Regarding the servo effects of the DCM 40 shown in FIG. 5, they are the same as for the DCM 19 shown in FIG. 2. If the MSB duty cycle is greater than 50%, then the error output signal 17 swings negatively from its prior value, causing the combined output signal 12 to be brought more negative in value and consequently bring the output data 14 of the target ADC 13 to a lower value, and trending the MSB 15 back to a 50% duty cycle. Conversely, if the MSB duty cycle is less than 50% then opposite action occurs, bringing the output data 14 from the target ADC 13 to a higher value, and trending the MSB 15 back toward a 50% duty cycle. When the MSB duty cycle is exactly 50%, then no change is imparted by the integrator 38 to the error output signal 17.

It will be appreciated that there are probably an unlimited number of multifunctional circuits which could be constructed to perform the just described functions depicted in FIG. 5. It is emphasized that any such circuits used in the manner described above is within the spirit and scope of the present invention. By way of example only, FIG. 6 shows such a multifunctional opamp circuit 40.

Figure 6:
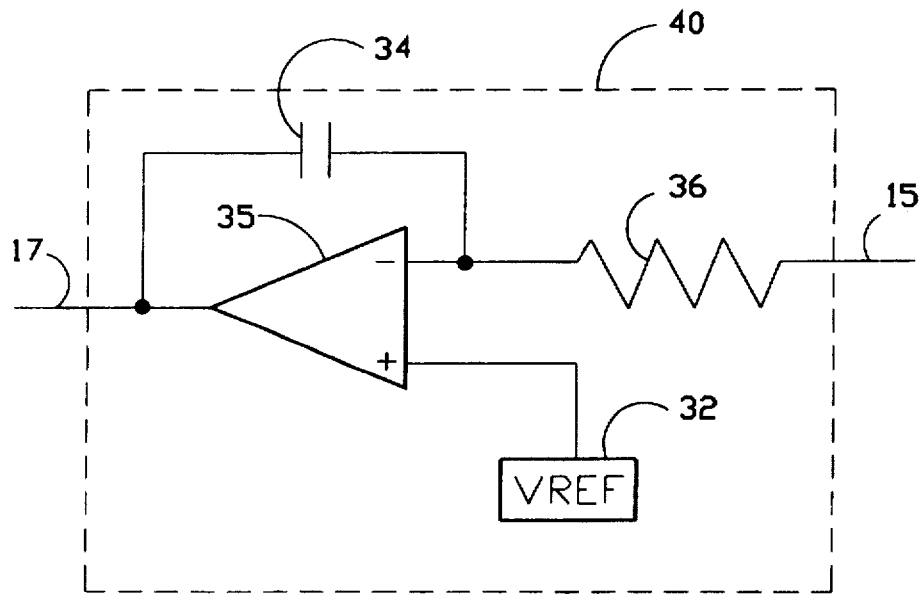
FIG. 6 is a schematic diagram of a multifunction equivalent circuit of an operational amplifier shown in FIG. 5.

Referring to FIG. 6, there is shown an opamp circuit 40 which has the same designation as shown in FIG. 5. The opamp circuit 40 comprises both a Vref 32 and an MSB input 15. This circuit 40 performs all the functions of the difference amplifier 31 and the integrator 38 shown in FIG. 5. Although, the operation of the circuit 40 shown in FIG. 6 and how it is equivalent to the described circuit shown in FIG. 5 may well be quite obvious, the equivalency will now be described. Referring to FIG. 6, a feedback capacitor 34 around an opamp 35 in conjunction with resistor 36 comprise a linear voltage integrator containing a first order lowpass filter response. The opamp 35 provides a natural differencing function simultaneous with the function of the integrator 38 described in FIG. 5. By coupling the MSB pulse 15 to the integration resistor 36, and coupling the Vref 32 to the positive input of the opamp 35, the MSB pulse 15 is simultaneously integrated, subtracted from the value of Vref 32, and given a very large error gain approximately equal to the opamp's d.c. open loop gain.

Figure 7:
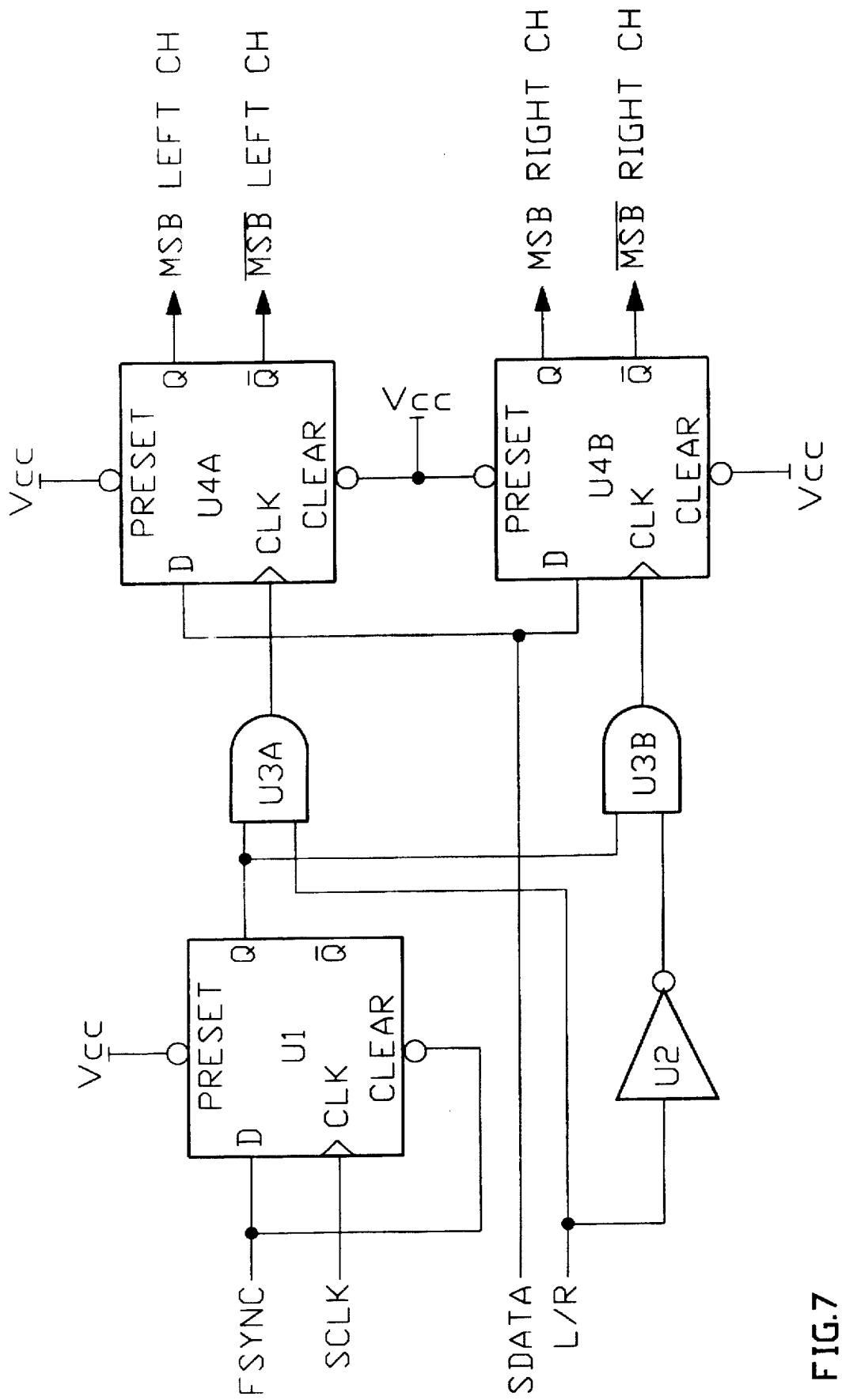
FIG. 7 is a circuit for trapping and sampling the output of the MSB of a serial data word.

Referring to FIG. 7, there is shown an example of a circuit which can be used to trap and sample out the MSB of a serial data word. This circuit is constructed to work with a Crystal Semiconductor type CS5390 stereo analog-to-digital converter.

The circuit catches the left and right channel MSB data from the serial word frame and clocks out the two MSB's synchronously with the frame sync time interval which is equal to the data sample rate.

By way of example only, U1, U4A and U4B are sections of a 74HCT74 dual Type-D flip-flop; U2 is one gate of a 74HCT04 hex inverter; and U3A and U3B are two gates of a 74HCT08 quad 2-input AND gate. The "FSYNC" line is the frame synchronizing pulse of the ADC; the "SCLK" line is the ADC's serial data clock; the "SDATA" line is the serial data from the ADC; and the "L/R" line is the left/right select line from the ADC.

U1 generates from "FSYNC" and "SCLK" lines, a timing pulse representing the data interval of both left and right MSB's within the serial word of "SDATA" line. Gates U3A and U3B with inverter U2 steer the timing pulse from U1 to either the input clock of U4A or the input clock of U4B depending upon the status of the "L/R" input line. The serial word "SDATA" line is supplied to the D input of both flip-flops of U4A and U4B. Flip-flops U4A and U4B serve to trap and hold the MSB data contained in "SDATA" line whenever they are clocked. By this means, the MSB data is held constant until the next frame interval, producing MSB outputs as required for use by the present invention DCM.

Defined in detail, the present invention is a drift canceling means used in conjunction with a target analog-to-digital converter (ADC) which has an input and an output, the output of the target ADC producing an output data word having a most significant bit (MSB), the drift canceling means comprising: (a) a logic inverter having an input coupled to the output of the target ADC for receiving the MSB from the output data word, and an output for producing an inverse output signal of the MSB; (b) a differential integrator having a first input also coupled to the output of the target ADC for receiving the MSB from the output data word, a second input coupled to the output of the logic inverter for receiving the inverse output signal of the MSB, and an output for producing an output error signal; (c) a summing means having a first input for receiving an analog input signal, a second input coupled to the output of the differential integrator for receiving the output error signal, and an output for producing a combined output signal of the analog input signal and the output error signal; and (d) the differential integrator integrating the difference between the magnitude of the MSB and the inverse output signal of the MSB such that when the MSB duty cycle is being greater than 50%, the output error signal of the differential integrator moves negatively from its prior value which causes the combined output signal from the summing means to be more negative in value and moves the output data word of the target ADC to a lower value so that the MSB is back to a 50% duty cycle, and when the MSB duty cycle is being less than 50%, then an opposite action occurs which causes the output data word from the target ADC to a higher value and moves the MSB back toward the 50% duty cycle, and when the MSB duty cycle is being exactly 50%, then no change is imparted by the differential integrator to the output error signal.

Defined broadly, the present invention is a drift canceling means used in conjunction with a target analog-to-digital converter (ADC) which has an input and an output, the output of the target ADC producing an output data word having a most significant bit (MSB), the drift canceling means comprising: (a) an integrator having an input coupled to the output of the target ADC for receiving the MSB from the output data word, and an output for producing an integrated sample output voltage proportional to an average duty cycle of the MSB; (b) a reference voltage being set approximately equal to the integrated sample output voltage of the integrator when the average duty cycle of the MSB is 50%; (c) a difference amplifier having a first input coupled to the output of the integrator for receiving the integrated sample output voltage, a second input coupled to the reference voltage, and an output for producing an output error voltage subtracted by the sample output voltage from the reference voltage; and (d) a summing means having a first input for receiving an analog input signal, a second input coupled to the output of the difference amplifier for receiving the output error voltage, and an output for producing a combined output signal from the analog input signal and the output error voltage, where the MSB duty cycle is being greater than 50%, the output error voltage of the difference amplifier moves negatively from its prior value which causes the combined output signal to be more negative in value and moves the output data word of the target ADC to a lower value so that the MSB is back to a 50% duty cycle, and when the MSB duty cycle is being less than 50%, then an opposite action occurs which causes the output data word from the target ADC to a higher value and moves the MSB back toward the 50% duty cycle, and when the MSB duty cycle is being exactly 50%, then no change is imparted by the difference amplifier to the output error signal.

Defined more broadly, the present invention is an offset canceling means used in conjunction with a target analog-to-digital converter (ADC) which generates an output data word having a most significant bit (MSB), the offset canceling means comprising: (a) an error detector having means for receiving the MSB from the output data word of the target ADC, analyzing an average duty cycle of the MSB, and producing an error output signal whenever the average duty cycle is at a predetermined percentage; and (b) means for receiving and summing the error output signal with an analog input signal and producing a combined output signal which is received by the target ADC for causing an average value of the MSB to move toward the center of the data span, and thereby corrects the average duty cycle of the MSB to move back toward the predetermined percentage.

Defined even more broadly, the present invention is an offset canceling means used in conjunction with a target analog to digital converter (ADC) which the target ADC generates an output data word having a most significant bit (MSB), the offset canceling means comprising: (a) means for receiving the MSB from the output data word of the target ADC, and analyzing an average duty cycle of the MSB, and providing an output error signal whenever the average duty cycle is drifted away from a predetermined percentage; and (b) means for summing the output error signal together with an analog input signal, and producing a combined output signal to the target ADC for causing the MSB average duty cycle to move back toward the predetermined percentage.

Alternatively defined, the present invention is a drift canceling method to cancel an output data word of a target analog to digital converter (ADC) which has a most significant bit (MSB), the method comprising the steps of: (a) receiving the MSB from the output data word of the target ADC, and analyzing an average duty cycle of the MSB, and producing an output error signal whenever the average duty cycle is drifted away from a predetermined percentage; and (b) summing the output error signal together with an analog input signal, and producing a combined output signal to the target ADC for causing the MSB average duty cycle to move back toward the predetermined percentage.

Of course the present invention is not intended to be restricted to any particular form or arrangement, or any specific embodiment disclosed herein, or any specific use, since the same may be modified in various particulars or relations without departing from the spirit or scope of the claimed invention herein above shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A drift canceling means used in conjunction with a target analog-to-digital converter (ADC) which has an input and an output, the output of the target ADC producing an output data word having a most significant bit (MSB), the drift canceling means comprising:

a. a logic inverter having an input coupled to said output of said target ADC for receiving said MSB from said output data word, and an output for producing an inverse output signal of said MSB;

b. a differential integrator having a first input also coupled to said output of said target ADC for receiving said MSB from said output data word, a second input coupled to said output of said logic inverter for receiving said inverse output signal of said MSB, and an output for producing an output error signal;

c. a summing means having a first input for receiving an analog input signal, a second input coupled to said output of said differential integrator for receiving said output error signal, and an output for producing a combined output signal of the analog input signal and said output error signal; and d. said differential integrator integrating the difference between the magnitude of said MSB and said inverse output signal of said MSB such that when said MSB duty cycle is being greater than 50%, said output error signal of said differential integrator moves negatively from its prior value which causes said combined output signal from said summing means to be more negative in value and moves said output data word of said target ADC to a lower value so that said MSB is back to a 50% duty cycle, and when said MSB duty cycle is being less than 50%, then an opposite action occurs which causes said output data word from said target ADC to a higher value and moves said MSB back toward the 50% duty cycle, and when said MSB duty cycle is being exactly 50%, then no change is imparted by said differential integrator to said output error signal.

2. The drift canceling means in accordance with claim 1 wherein said differential integrator includes an opamp, a first time constant, and a second time constant, where the first time constant being substantially equal to the second time constant.

3. The drift canceling means in accordance with claim 1 wherein said differential integrator includes a difference amplifier and a time constant.

4. The drift canceling means in accordance with claim 3 wherein said difference amplifier includes an opamp difference amplifier.

5. The drift canceling means in accordance with claim 3 wherein said difference amplifier includes a differential comparator.

6. A drift canceling means used in conjunction with a target analog-to-digital converter (ADC) which has an input and an output, the output of the target ADC producing an output data word having a most significant bit (MSB), the drift canceling means comprising:

a. an integrator having an input coupled to said output of said target ADC for receiving said MSB from said output data word, and an output for producing an integrated sample output voltage proportional to an average duty cycle of said MSB;

b. a reference voltage being set approximately equal to said integrated sample output voltage of said integrator when the average duty cycle of said MSB is 50%; and c. a difference amplifier having a first input coupled to said output of said integrator for receiving said integrated sample output voltage, a second input coupled to said reference voltage, and an output for producing an output error voltage subtracted by said sample output voltage from said reference voltage;

d. a summing means having a first input for receiving an analog input signal, a second input coupled to said output of said difference amplifier for receiving said output error voltage, and an output for producing a combined output signal from the analog input signal and said output error voltage, where said MSB duty cycle is being greater than 50%, said output error voltage of said difference amplifier moves negatively from its prior value which causes the combined output signal to be more negative in value and moves said output data word of said target ADC to a lower value so that said MSB is back to a 50% duty cycle, and when said MSB duty cycle is being less than 50%, then an opposite action occurs which causes said output data word from said target ADC to a higher value and moves said MSB back toward the 50% duty cycle, and when said MSB duty cycle is being exactly 50%, then no change is imparted by said difference amplifier to said output error signal.

7. The drift canceling means in accordance with claim 6 wherein said integrator includes a feedback capacitor around said difference amplifier and connected to a resistor for providing a linear voltage integrator containing a first order lowpass filter response.

8. An offset canceling means used in conjunction with a target analog-to-digital converter (ADC) which generates an output data word having a most significant bit (MSB), the offset canceling means comprising:

a. an error detector having means for receiving said MSB from said output data word of said target ADC, analyzing an average duty cycle of said MSB, and producing an error output signal whenever the average duty cycle is at a predetermined percentage;

b. said error detector further having a differential integrator for receiving said MSB from said output data word of said target ADC and an inverter logic for also receiving and inverting said MSB, where the differential integrator integrates said MSB and the inverse signal of said MSB to produce said error output signal; and c. means for receiving and summing said error output signal with an analog input signal and producing a combined output signal which is received by said target ADC for causing an average value of said MSB to move toward the center of the data span, and thereby corrects the average duty cycle of said MSB to move back toward said predetermined percentage.

9. The offset canceling means in accordance with claim 8 wherein said predetermined percentage is approximately 50%.

10. The offset canceling means in accordance with claim 8 wherein said error detector includes an integrator for receiving said MSB from said output data word of said target ADC and producing an integrated sample output voltage proportional to the average duty cycle of said MSB, a reference voltage being set approximately equal to the integrated sample output voltage of the integrator when the average duty cycle of said MSB is at said predetermined percentage, and a difference amplifier for receiving the integrated sample output voltage and producing said output error voltage.

11. The offset canceling means in accordance with claim 8 wherein said means for receiving and summing said error output signal includes a summing means.

12. An offset canceling means used in conjunction with a target analog to digital converter (ADC) which the target ADC generates an output data word having a most significant bit (MSB), the offset canceling means comprising:
   a. means for receiving said MSB from said output data word of said target ADC, and analyzing an average duty cycle of said MSB, and providing an output error signal whenever the average duty cycle is drifted away from a predetermined percentage;
   b. said means for receiving said MSB further including,
      (i) a logic inverter for receiving said MSB from said output data word of said target ADC and producing an inverse output signal of said MSB,
      (ii) a differential integrator for also receiving said MSB from said output data word of said target ADC and said inverse output signal of said MSB, and producing the output error signal,
      (iii) said differential integrator integrating the difference between the magnitude of said MSB and said inverse output signal of said MSB such that when said MSB duty cycle is being greater than the predetermined percentage, said output error signal of said differential integrator moves negatively from its prior value, which causes said combined output signal to be more negative in value and moves said output data word of said target ADC to a lower value so that said MSB is back to the predetermined percentage duty cycle, and when said MSB duty cycle is being less than the predetermined percentage, then an opposite action occurs, which causes said output data word from said target ADC to a higher value and moves said MSB back toward the predetermined percentage duty cycle, and when said MSB duty cycle is being exactly the predetermined percentage, then no change is imparted by said differential integrator to said error output signal; and
   c. means for summing said output error signal together with an analog input signal, and producing a combined output signal to said target ADC for causing said MSB average duty cycle to move back toward said predetermined percentage.

13. The offset canceling means in accordance with claim 12 wherein said predetermined percentage is approximately 50%.

14. The offset canceling means in accordance with claim 12 wherein said means for receiving said MSB, and analyzing the average duty cycle of said MSB, and providing the output error signal include:
   a. an integrator for receiving said MSB from said output data word of said target ADC, and producing an integrated sample output voltage proportional to the average duty cycle of said MSB;
   b. a reference voltage being set approximately equal to said integrated sample output voltage of said integrator when the average duty cycle of said MSB is at said predetermined percentage;
   c. a difference amplifier for receiving said integrated sample output voltage and said reference voltage, and producing an output error voltage subtracted by said integrated sample output voltage from said reference voltage, and when said MSB duty cycle is being greater than said predetermined percentage, the output error voltage of the difference amplifier moves negatively from its prior value, which causes said combined output signal to be more negative in value and moves said output data word of said target ADC to a lower value so that said MSB is back to said predetermined percentage duty cycle, and when said MSB duty cycle is being less than said predetermined percentage, then an opposite action occurs, which causes said output data word from said target ADC to a higher value and moves said MSB back toward the predetermined percentage duty cycle, and when said MSB duty cycle is being exactly said predetermined percentage, then no change is imparted by the difference amplifier to said error output signal.

15. The offset canceling means in accordance with claim 12 wherein said means for summing said output error signal together with said analog input signal includes a summing member.

16. An offset canceling means used in conjunction with a target analog-to-digital converter (ADC) which generates an output data word having a most significant bit (MSB), the offset canceling means comprising:
   a. an error detector having means for receiving said MSB from said output data word of said target ADC, analyzing an average duty cycle of said MSB, and producing an error output signal whenever the average duty cycle is at a predetermined percentage;
   b. said error detector further having an integrator for receiving said MSB from said output data word of said target ADC and producing an integrated sample output voltage proportional to the average duty cycle of said MSB, a reference voltage being set approximately equal to the integrated sample output voltage of the integrator when the average duty cycle of said MSB is at said predetermined percentage, and a difference amplifier for receiving the integrated sample output voltage and producing said output error voltage; and
   c. means for receiving and summing said error output signal with an analog input signal and producing a combined output signal which is received by said target ADC for causing an average value of said MSB to move toward the center of the data span, and thereby corrects the average duty cycle of said MSB to move back toward said predetermined percentage.

17. The offset canceling means in accordance with claim 16 wherein said predetermined percentage is approximately 50%.

18. The offset canceling means in accordance with claim 16 wherein said means for receiving and summing said error output signal includes a summing means.

19. An offset canceling means used in conjunction with a target analog to digital converter (ADC) which the target ADC generates an output data word having a most significant bit (MSB), the offset canceling means comprising:
   a. means for receiving said MSB from said output data word of said target ADC, and analyzing an average duty cycle of said MSB, and providing an output error signal whenever the average duty cycle is drifted away from a predetermined percentage; and
   b. said means for receiving said MSB further including, (i) an integrator for receiving said MSB from said output data word of said target ADC, and producing an integrated sample output voltage proportional to the average duty cycle of said MSB, (ii) a reference voltage being set approximately equal to said integrated sample output voltage of said integrator when the average duty cycle of said MSB is at said predetermined percentage, (iii) a difference amplifier for receiving said integrated sample output voltage and said reference voltage, and producing an output error voltage subtracted by said integrated sample output voltage from said reference voltage, and when said MSB duty cycle is being greater than said predetermined percentage, the output error voltage of the difference amplifier moves negatively from its prior value, which causes said combined output signal to be more negative in value and moves said output data word of said target ADC to a lower value so that said MSB is back to said predetermined percentage duty cycle, and when said MSB duty cycle is being less than said predetermined percentage, then an opposite action occurs, which causes said output data word from said target ADC to a higher value and moves said MSB back toward the predetermined percentage duty cycle, and when said MSB duty cycle is being exactly said predetermined percentage, then no change is imparted by the difference amplifier to said error output signal; and c. means for summing said output error signal together with an analog input signal, and producing a combined output signal to said target ADC for causing said MSB average duty cycle to move back toward said predetermined percentage.

20. The offset canceling means in accordance with claim 19 wherein said predetermined percentage is approximately 50%.

21. The offset canceling means in accordance with claim 19 wherein said means for summing said output error signal together with said analog input signal includes a summing member.

* * * * *